United States Patent
Lee

(10) Patent No.: US 10,079,270 B2
(45) Date of Patent: Sep. 18, 2018

(54) FLEXIBLE DISPLAY DEVICE

(71) Applicant: SAMSUNG DISPLAY CO., LTD., Yongin-si, Gyeonggi-do (KR)

(72) Inventor: Sang Wol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 235 days.

(21) Appl. No.: 14/946,709

(22) Filed: Nov. 19, 2015

(65) Prior Publication Data

US 2016/0316575 A1 Oct. 27, 2016

(30) Foreign Application Priority Data

Apr. 24, 2015 (KR) .................. 10-2015-0058115

(51) Int. Cl.
*H01L 27/32* (2006.01)
*H04M 1/02* (2006.01)

(52) U.S. Cl.
CPC ........ *H01L 27/323* (2013.01); *H04M 1/0268* (2013.01); *H01L 2251/5338* (2013.01)

(58) Field of Classification Search
CPC . H01L 27/323; H01L 2251/5338; H04M 1/02
USPC .................................................. 361/679.27
See application file for complete search history.

(56) References Cited

U.S. PATENT DOCUMENTS

| | | | |
|---|---|---|---|
| 2007/0211036 A1 | 9/2007 | Perkins | |
| 2010/0210311 A1* | 8/2010 | Ahn | G06F 1/1616 455/566 |
| 2012/0204453 A1* | 8/2012 | Jung | G09F 9/301 40/517 |
| 2012/0274570 A1* | 11/2012 | Kim | H04M 1/0237 345/168 |
| 2013/0156354 A1* | 6/2013 | Mitsui | H04M 1/0237 384/35 |
| 2014/0183478 A1* | 7/2014 | Lee | H01L 51/56 257/40 |
| 2015/0296060 A1* | 10/2015 | Gu | H04M 1/0235 455/575.4 |

FOREIGN PATENT DOCUMENTS

| | | |
|---|---|---|
| JP | 2004-118151 A | 4/2004 |
| KR | 10-0818170 B1 | 4/2008 |
| KR | 10-0917683 B1 | 9/2009 |
| KR | 10-1055775 B1 | 8/2011 |
| KR | 10-1122196 B1 | 3/2012 |

* cited by examiner

*Primary Examiner* — Michael P McFadden
(74) *Attorney, Agent, or Firm* — Lewis Roca Rothgerber Christie LLP

(57) ABSTRACT

A display device according to an exemplary embodiment includes a base portion, a first support plate slidably coupled to the base portion, and configured to support a display module, a second support plate below the first support plate and hinge-combined to the base portion to be vertically rotatable with movement of the first support plate, and configured to support the display module, and an elastic member between the base portion and the second support plate, and configured to provide an elastic force to rotate the second support plate upward with movement of the first support plate.

15 Claims, 12 Drawing Sheets

FIG. 1A
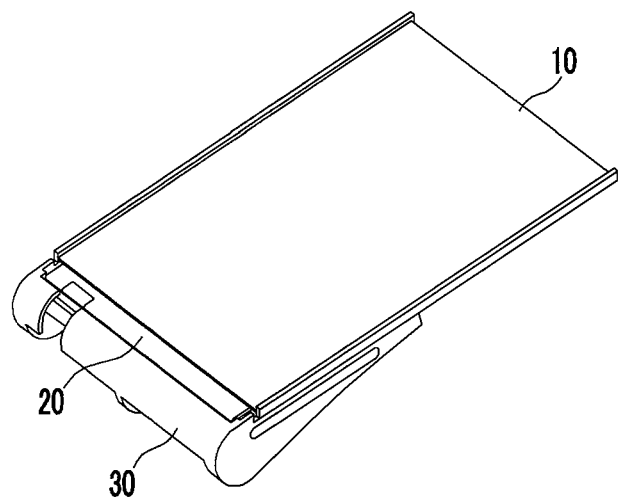
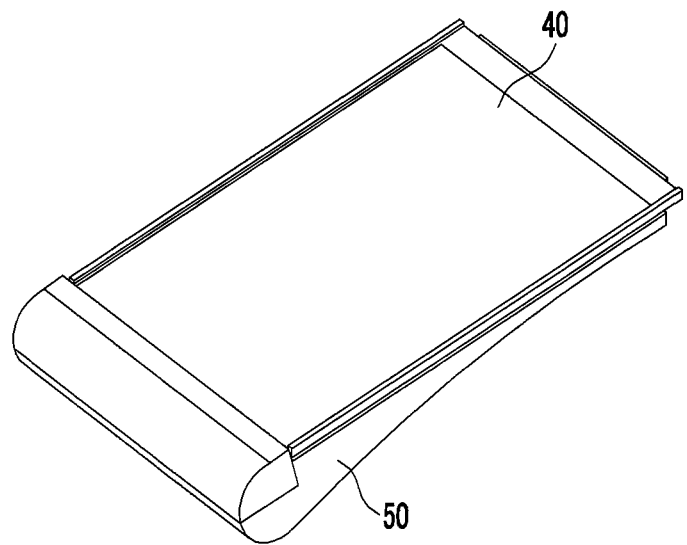
FIG. 1B

FIG. 2A
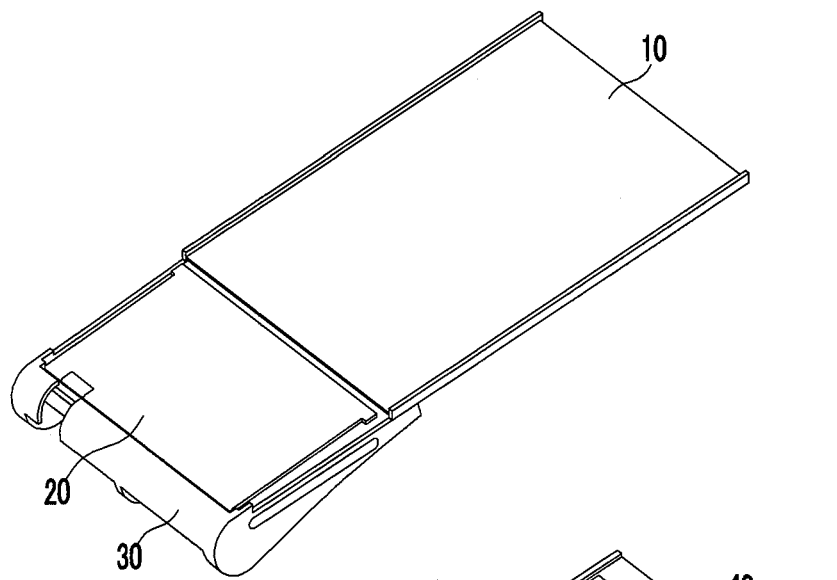
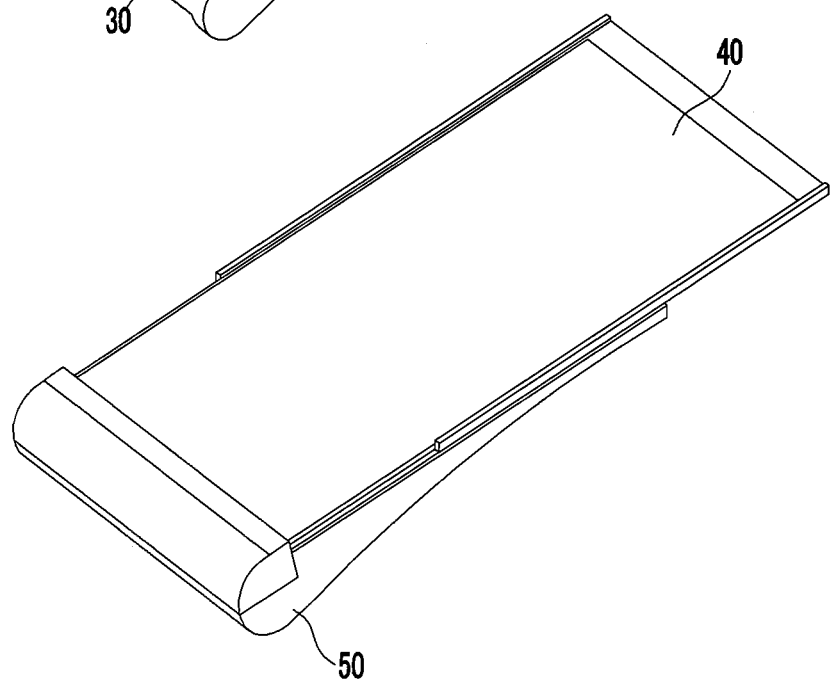
FIG. 2B

FLEXIBLE DISPLAY DEVICE

CROSS-REFERENCE TO RELATED APPLICATION

This application claims priority to, and the benefit of, Korean Patent Application No. 10-2015-0058115 filed in the Korean Intellectual Property Office on Apr. 24, 2015, the entire contents of which are incorporated herein by reference.

BACKGROUND

1. Field

The described technology relates generally to a display device, and more particularly, to a display device having a support structure that supports a display module having a variable screen.

2. Description of the Related Art

Presently known flat display devices include a liquid crystal display (LCD), a plasma display panel (PDP), an organic light emitting diode (OLED) device, a field effect display (FED), an electrophoretic display device, and the like.

Generally, laminated layers of the display device may include a display panel including a thin film transistor layer and an emission layer, a polarization film on the display panel, and/or a touch screen panel (TSP). At the outmost portion of the display device, these layers are encapsulated by using a transparent window to prevent external moisture or oxygen from penetrating.

In the case of a flexible display device having a variable screen, the display device includes a wrappable or rollable display module, and when the display module is unrolled, a lower auxiliary structure partially supports the display module, and the screen shape is maintained, but if a user touches, pushes, or presses the screen, there may be damage caused to the display device.

The above information disclosed in this Background section is only for enhancement of understanding of the background of the described technology, and therefore it may contain information that does not form the prior art that is already known in this country to a person of ordinary skill in the art.

SUMMARY

An exemplary embodiment provides a display device to which a display module support structure that supports or fixes the display module to the upper surface of the display device, thereby maintaining a screen shape, and preventing damage to the screen from pushing or pressing due to a user touch operation.

A display device according to an exemplary embodiment includes a base portion, a first support plate slidably coupled to the base portion, and configured to support a display module, a second support plate below the first support plate and hinge-combined to the base portion to be vertically rotatable with movement of the first support plate, and configured to support the display module, and an elastic member between the base portion and the second support plate, and configured to provide an elastic force to rotate the second support plate upward with movement of the first support plate.

The base portion may include an inclined side therein, and the display module may be configured to slide along the inclined side.

The first support plate may be configured to slide along an opening in a side surface of the base portion.

The elastic member may include a spring.

The elastic member may be between an inner surface of the base portion and the bottom surface of the second support plate.

One end of the elastic member is coupled to an elastic member fixing protrusion at the inner surface of the base portion, and another end of the elastic member may be supported by the bottom surface of the second support plate.

The display device may further include a separation prevention hook at an upper edge of the first support plate that is configured to prevent separation of the display module.

The first support plate may include a first locking portion protruding downward from an end of the first support plate, the second support plate may include a second locking portion protruding downward from an edge of the second support plate, and the display module may be configured to be opened by moving the first support plate with respect to the base, causing the first locking portion and the second locking portion to engage, and thereby leveling the second support plate with the first support plate.

The first support plate and the second support plate may be configured to horizontally support the display module when the display module is opened.

The display module may include a rollable panel.

The base portion may include a curved outer surface for rolling of the display module.

The display module may include a flexible display substrate, a display element layer may include a plurality of pixels on the flexible display substrate, a thin film encapsulation layer covering the display substrate and the display element layer, and a touch panel on the thin film encapsulation layer.

The display element layer may include an organic light emission element.

The display device may further include a window layer on the thin film encapsulation layer.

The window layer may include a plastic substrate made of polyimide (PI) or polyethylene terephthalate (PET).

According to the exemplary embodiment, a variable screen of the display device can be expanded, the screen shape can be maintained when the screen is expanded, and the screen can be prevented from being damaged due to a screen touch operation of a user.

BRIEF DESCRIPTION OF THE DRAWINGS

FIGS. 1A and 1B schematically illustrate a perspective view of a display device before opening a display module according to an exemplary embodiment.

FIGS. 2A and 2B schematically illustrate a perspective view of the display device after opening the display module according to the exemplary embodiment.

DETAILED DESCRIPTION

Figure 3:
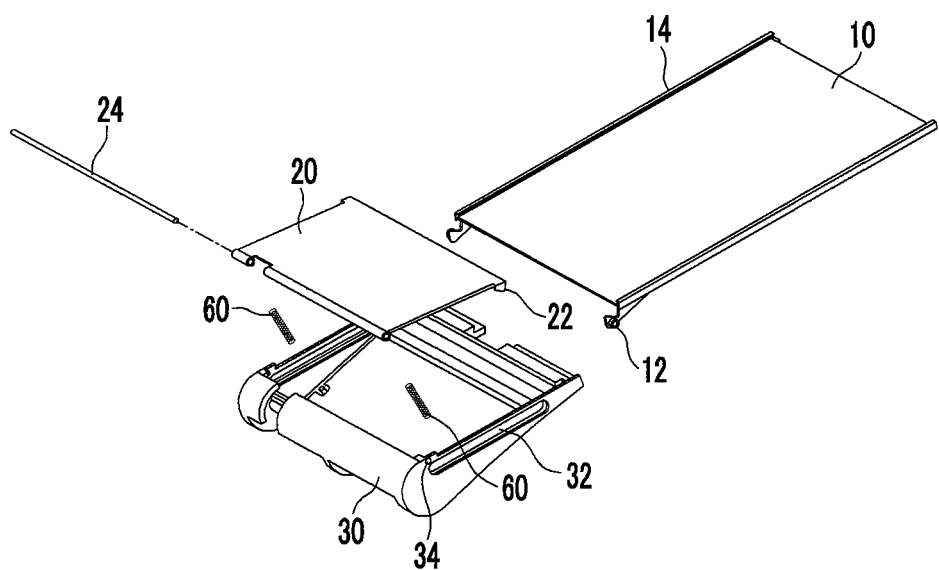
FIG. 3 schematically illustrates an exploded perspective view of the display device according to the exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Various modifications of the exemplary embodiments as depicted in the drawings are anticipated. Therefore, the exemplary embodiments are not limited to a specific form of an illustrated region, and, for example, include modifications of a manufactured form.

Hereinafter, a display device according to an exemplary embodiment will be described with reference to FIGS. 1A, 1B, 2A, and 2B.

FIGS. 1A and 1B schematically illustrate a perspective view of a display device before opening a display module according to an exemplary embodiment, and FIGS. 2A and 2B schematically illustrate the display device after opening the display module according to the exemplary embodiment.

Referring to FIGS. 1A, 1B, 2A, and 2B, a display device includes a base portion 30, a first support plate 10, and a second support plate 20. The base portion 30 provides a space into which a display module 40 slides. The first support plate 10 is slidably combined to the base portion 30, and supports the display module 40 with an upper surface thereof. The second support plate 20 is located below the first support plate 10 (when the display module 40 is closed), and is hinge-combined to the base portion 30 to be vertically rotatable along with movement of the first support plate 10, and supports the display module 40.

As shown in FIGS. 1A and 1B, before the display module 40 is opened, the second support plate 20 overlaps a lower portion of the first support plate 10, and the base portion 30 is covered by a base case 50 of the base portion. Further, as shown in FIGS. 2A and 2B, after the display module 40 is opened (e.g., the screen, or display device, is expanded), the first support plate 10 slides to the outer side along an opening 32 (refer to FIG. 3) formed in the base portion 30, and the second support plate 20 is wholly exposed to be in parallel with, or substantially level with, the first support plate 10. An external portion of the base portion 30 is covered by the base case 50.

FIG. 3 schematically illustrates an exploded perspective view of the display device according to the exemplary embodiment.

Referring to FIG. 3, the base portion 30 may have an inclined side formed therein, and the display module 40 may slidably move within the base portion 30 along an outer surface of the inclined side.

The first support plate 10 is slidably combined to the base portion 30 along the opening 32 formed in a side surface of the base portion 30. The first support plate 10 includes a first locking portion 12 protruding to a lower outer side from an end of the first support plate 10. The first locking portion 12 is inserted into the opening 32 formed in the side surface of the base portion 30, and thus, as the first support plate 10 slidably moves, the opening 32 guides movement of the first support plate 10, and the first locking portion 12 prevents the first support plate 10 from being separated from the base portion 30. In addition, a separation prevention hook 14 that prevents separation of the display module 40 may be provided at an upper edge of the base portion 30.

The second support plate 20 is located below the first support plate 10, and may vertically rotate along with movement of the first support plate 10 by being hinge-combined to the base portion 30. The second support plate 20 is combined to a hinge shaft 24, and the hinge shaft 24 is combined to a hinge opening 34 such that the second support plate 20 can vertically rotate about the axis of the hinge shaft 24. When the first support plate 10 is completely opened, the second support plate 20 is exposed to the outside so as to be maintained in parallel with (e.g., substantially level with) the first support plate 10, and when the first support plate 10 is completely closed, the second support plate 20 is located below the first support plate 10.

Meanwhile, an elastic member 60 may be provided between the base portion 30 and the second support plate 20. The elastic member 60 provides elastic force such that the second support plate 20 can rotate upward along with movement of the first support plate 10. The elastic member 60 may be formed of a spring. The elastic member 60 may be provided between an inner surface of the base portion 30 and a bottom surface of the second support plate 20. That is, when the first support plate 10 is completely closed, the first support plate 10 presses the second support plate 20 and a force is applied to the upper side of the elastic member 60. When the first support plate 10 is opened, the pressure to the second support plate 20 from the first support plate 10 is weakened and thus the elastic member 60 pushes the second support plate 20 upward to make the second support plate 20 rotate upward, and when the first support plate 10 is completely opened, the first support plate 10 and the second support 20 become parallel (e.g., substantially level) with each other and support the display module 40.

Figure 4:
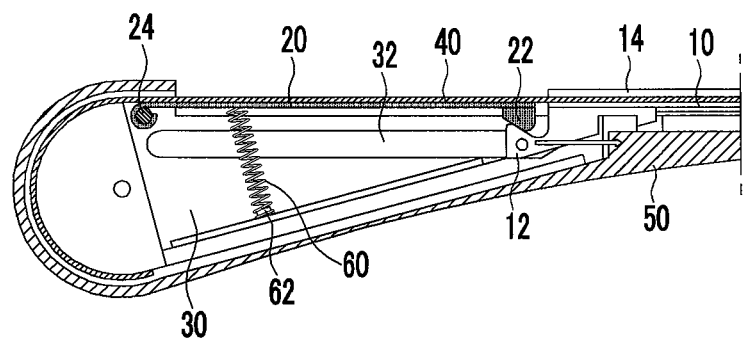
FIG. 4 schematically illustrates a cross-sectional view of the display device according to the exemplary embodiment.

FIG. 4 schematically illustrates a cross-sectional view of the display device according to the exemplary embodiment. Referring to FIG. 4, one end of the elastic member 60 may be fitted into an elastic member fixing protrusion 62 provided at an inner surface of the base portion 30, and the end of the elastic member 60 may be fixed by being supported by the bottom surface of the second support plate 20. The other end of the elastic member 60 may be fitted into another elastic member fixing protrusion formed at the bottom surface of the second support plate 20.

The first support plate 10 includes the first locking portion 12 protruding downward from an end of the first support plate 10, and the second support plate 20 includes a second locking portion 22 protruding downward from an end of the second support plate 20. When the first support plate 10 slides during opening of the display module 40, the first locking portion 12 and the second locking portion 22 are engaged with each other such that the first support plate 10 and the second plate 20 maintain their parallel/level state.

Figure 5A:
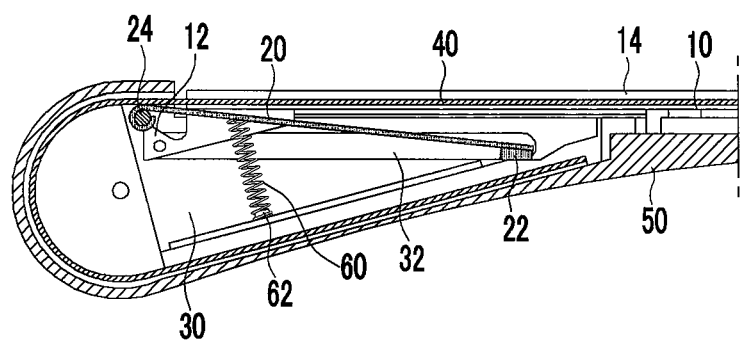
FIG. 5A schematically illustrates a cross-sectional view of the display device before opening the display module according to the exemplary embodiment.
Figure 5B:
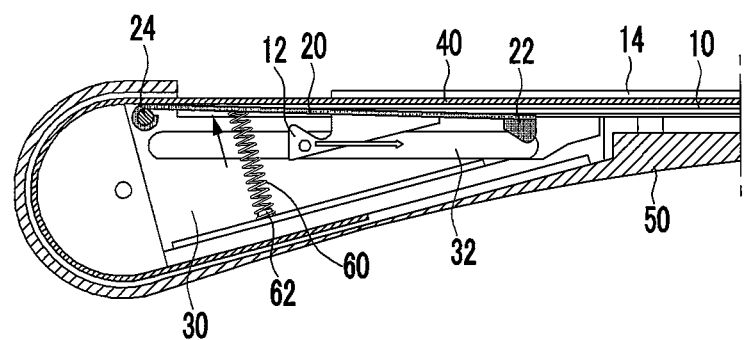
FIG. 5B schematically illustrates a cross-sectional view of the display device after partially opening the display module according to the exemplary embodiment.
Figure 5C:
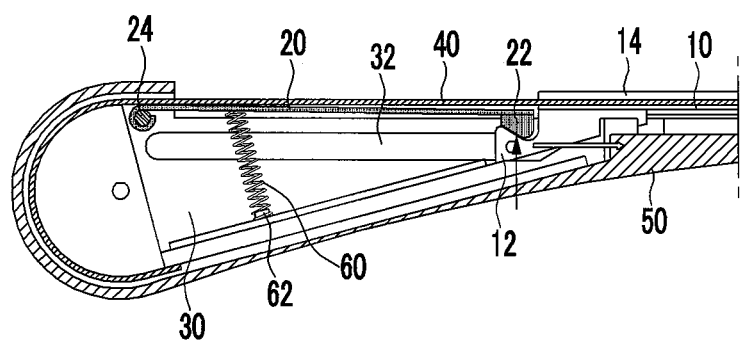
FIG. 5C schematically illustrates the display device after partial expansion of the display module according to the exemplary embodiment.
Figure 5D:
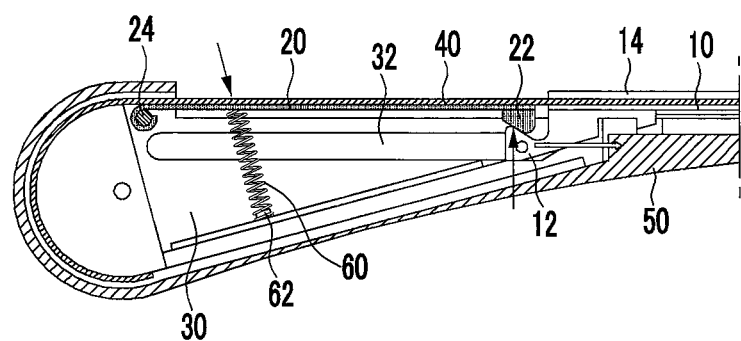
FIG. 5D schematically illustrates a cross-sectional view of the display device after complete expansion of the display module according to the exemplary embodiment.

FIG. 5A schematically illustrates a cross-sectional view of the display device before the display module is opened according to the exemplary embodiment, FIG. 5B and FIG. 5C schematically illustrate cross-sectional views of the display device after the display module is partially opened according to the exemplary embodiment, and FIG. 5D illustrates a cross-sectional view of the display device after the display module is completely opened according to the exemplary embodiment.

Referring to FIG. 5A to FIG. 5D, before the display module 40 is opened, the second support plate 20 is located below the first support plate 10, and the first support 10 presses the second support plate 20, and thus pressure from the second support plate 20 is applied to an upper portion of the elastic member 60 (e.g., to compress the elastic member 60, refer to FIG. 5A). When the display module 40 is partially opened, the first support plate 10 slides along the opening 32 formed in the side surface of the base portion 30, and thus the pressure applied to the second support plate 20 from the first support plate 10 is gradually weakened or reduced. Accordingly, the elastic member 60 pushes the second support plate 20 upward, and the second support plate 20 rotates upward with respect to the hinge shaft 24. As the first support plate 10 slides, the display module 40 gradually moves along the outer surface of the base portion 30 (refer to FIG. 5B). When the display module 40 is more opened, the first locking portion 12 protruding downward from the end of the first support plate 10 and the second locking portion 22 protruding downward from the end of the second support plate 20 are engaged with each other. In this case, the second support plate 20 rotates no further upward due to the elastic member 60 (refer to FIG. 5C). When the display module 40 is completely opened, the first locking portion 12 and the second locking portion 22 are engaged with each other, and thus they are located at locations where they cannot be separated from each other, and a pressure is applied to a lower side of the elastic member 60 such that an upward supporting force of the first locking portion 12 and a compressive force applied to a lower side of the elastic member 60 are balanced such that the display module 40 becomes substantially level.

Figure 6A:
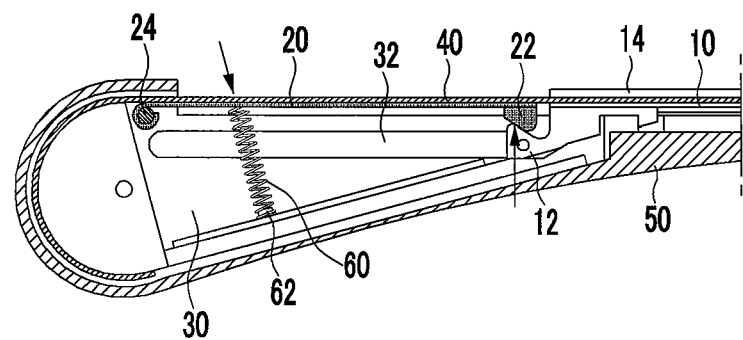
FIG. 6A schematically illustrates a cross-sectional view of the display device after complete expansion of the display module according to the exemplary embodiment.
Figure 6B:
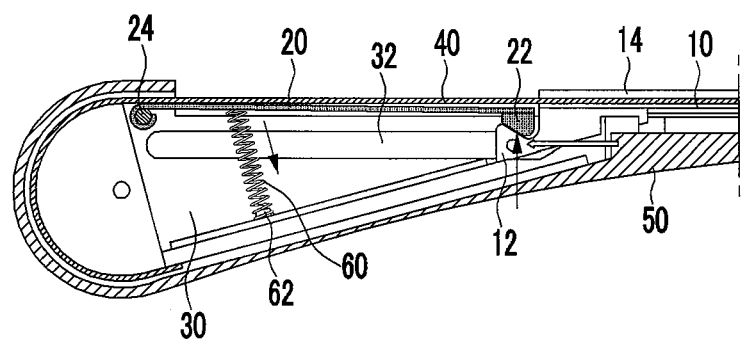
FIG. 6B schematically illustrates a cross-sectional view of the display device after partially closing of the display module according to the exemplary embodiment.
Figure 6C:
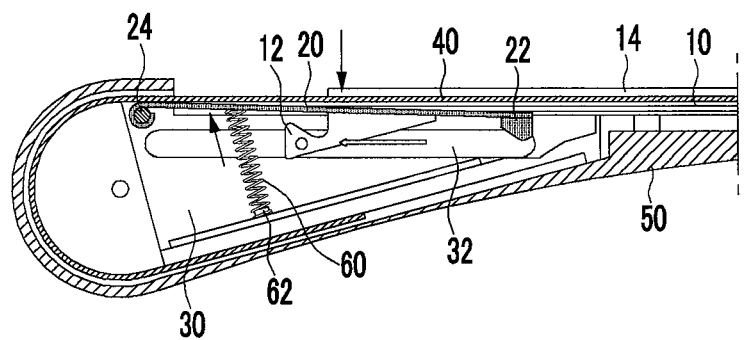
FIG. 6C schematically illustrates a cross-sectional view of the display device after partially closing of the display module according to the exemplary embodiment.
Figure 6D:
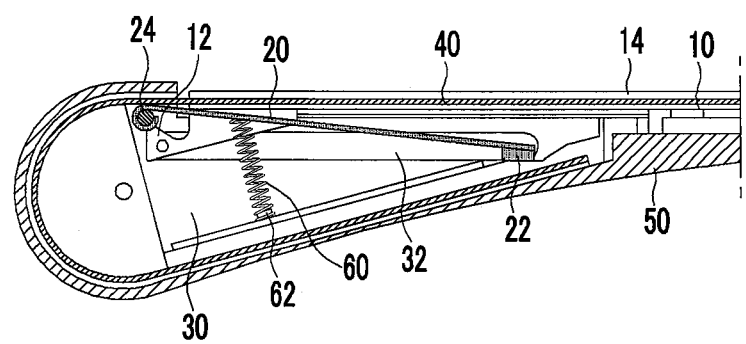
FIG. 6D schematically illustrates a cross-sectional view of the display device after complete closing of the display module according to the exemplary embodiment.

FIG. 6A schematically illustrates a cross-sectional view of the display device after the display module is completely opened according to the exemplary embodiment, FIG. 6B and FIG. 6C schematically illustrate the display device after the display module is partially closed according to the exemplary embodiment, and FIG. 6D schematically illustrates the display device after the display module is completely closed according to the exemplary embodiment.

Referring to FIG. 6A to FIG. 6D, when the display module 40 is completely opened, the first support plate 10 and the second support plate 20 are maintained in the parallel state/substantially level state, and the first locking portion 12 and the second locking portion 22 are engaged with each other such that an upward supporting force of the first locking portion 12 and a compressive force applied to a lower side of the elastic member 60 are balanced such that the display module 40 becomes substantially level (FIG. 6A). When the display module 40 is partially closed, the second support plate 20 is slightly pressed down by the first support plate 10, and the compressive force of the elastic member 60 is weakened or canceled by the opposing force of the first support plate 10 (FIG. 6B). When the display module 40 is closed further, the first support plate 10 slides along the opening 32 formed in the side surface of the base portion 30 such that the first support plate 10 presses the second support plate 20 with stronger force. Accordingly, the elastic member 60 pushes the second support plate 20 upward with stronger force (FIG. 6C). When the display module 40 is completely closed, the second support plate 20 is located below the first support plate 10, the first support plate 10 presses the second support plate 20 downward, and the elastic member 60 pushes the second support plate 20 upward.

Unlike the size of each of the first and second support plates 10 and 20 shown in the drawing, the size of the first support plate 10 and the size of the second support plate 20 may be changed according to the degree of sliding of the display module 40. Further, a horizontal to vertical ratio of the display module 40 in the completely closed state and a horizontal to vertical ratio of the display module 40 in the completely opened state may be respectively set to 4:3 and 16:9, or respectively 1:1 and 16:9.

The display module 40 may be a rollable module. In this case, the base portion 30 may have a semi-circular, curved, or bent outer surface for rolling of the display module 40.

The display module 40 may be a flexible display device that includes a flexible display substrate, a display element layer formed on the flexible display substrate and including a plurality of pixels, a thin film encapsulation layer covering the display substrate and the display element layer for protection, or a touch panel formed on the thin film encapsulation layer.

The display element layer is formed on the display substrate, and includes an element area where an active element is located, such as a thin film transistor, and an emission area where an emission layer is formed. The element area and the emission area may be distanced from each other, or may overlap each other. The display element layer may include an organic emission display element.

A window layer may be formed on the thin film encapsulation layer, and the window layer may be a plastic substrate made of polyimide (PI) or polyethylene terephthalate (PET).

A functional layer may be provided between the thin film encapsulation layer and the window layer. The functional layer may be formed of a phase delay film. The phase delay film may be a λ/4 phase delay film, and serves to change linear polarization to circular polarization, or to change circular polarization to linear polarization. The phase delay film may be a birefringence film that is made by performing stretching treatment on a film made of suitable polymers, such as polycarbonate or polyvinyl alcohol, polystyrene or polymethyl methacrylate, polypropylene or another polyolefin, and polyarylate or polyamide, an oriented film of a liquid crystal polymer, a film supporting an oriented layer of a liquid crystal polymer, and the like. Further, the phase delay film may be made of a Zeonor or Arton resin.

In addition, the functional layer may be made of a polarizer. The polarizer may reduce the thickness and improve the image visibility, while securing the flexibility characteristic.

As described, the display device according to the exemplary embodiment enables screen expansion of a variable screen and the screen shape can be maintained when the screen is expanded, and the screen can be prevented from being pushed or pressed by screen touch operation of a user.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Description of Some of the Reference Characters

| | |
|---|---|
| 10: first support plate | 20: second support plate |
| 30: base portion | 40: display module |
| 50: base case | 60: elastic member |
| 12: first locking portion | 14: separation prevention hook |
| 22: second locking portion | 24: hinge shaft |

-continued

Description of Some of the Reference Characters

32: opening 34: hinge opening
62: elastic member fixing protrusion

What is claimed is:

1. A display device comprising:
   a base portion;
   a first support plate slidably coupled to the base portion, and configured to support a single continuous and uniform display module;
   a second support plate below the first support plate when the display device is closed, hinge-combined to the base portion to be vertically rotatable with movement of the first support plate, and configured to support the single continuous and uniform display module; and
   an elastic member between the base portion and the second support plate, and configured to provide an elastic force to rotate the second support plate upward with movement of the first support plate.

2. The display device of claim 1, wherein the base portion comprises an inclined side therein, and wherein the display module is configured to slide along the inclined side.

3. The display device of claim 1, wherein the first support plate is configured to slide along an opening at a side surface of the base portion.

4. The display device of claim 1, wherein the elastic member comprises a spring.

5. The display device of claim 1, wherein the elastic member is between an inner surface of the base portion and a bottom surface of the second support plate.

6. The display device of claim 1, further comprising a separation prevention hook at an upper edge of the first support plate that is configured to prevent separation of the display module.

7. The display device of claim 1, wherein the first support plate comprises a first locking portion protruding downward from an end of the first support plate,
   wherein the second support plate comprises a second locking portion protruding downward from an edge of the second support plate, and
   wherein the display module is configured to be opened by moving the first support plate with respect to the base portion, causing the first locking portion and the second locking portion to engage, and thereby leveling the second support plate with the first support plate.

8. The display device of claim 7, wherein the first support plate and the second support plate are configured to horizontally support the display module when the display module is opened.

9. The display device of claim 1, wherein the display module comprises a rollable panel.

10. The display device of claim 9, wherein the base portion comprises a curved outer surface for rolling of the display module.

11. The display device of claim 1, wherein the display module comprises a flexible display substrate, a display element layer comprising a plurality of pixels on the flexible display substrate, a thin film encapsulation layer covering the flexible display substrate and the display element layer, and a touch panel on the thin film encapsulation layer.

12. The display device of claim 11, wherein the display element layer comprises an organic light emission element.

13. The display device of claim 11, further comprising a window layer on the thin film encapsulation layer.

14. The display device of claim 13, wherein the window layer comprises a plastic substrate made of polyimide (PI) or polyethylene terephthalate (PET).

15. A display device comprising:
   a base portion;
   a first support plate slidably coupled to the base portion, and configured to support a single continuous display module;
   a second support plate below the first support plate when the display device is closed, hinge-combined to the base portion to be vertically rotatable with movement of the first support plate, and configured to support the single continuous display module; and
   an elastic member between an inner surface of the base portion and a bottom surface of the second support plate, and configured to provide an elastic force to rotate the second support plate upward with movement of the first support plate,
   wherein one end of the elastic member is coupled to an elastic member fixing protrusion at the inner surface of the base portion, and wherein another end of the elastic member is supported by the bottom surface of the second support plate.

* * * * *